United States Patent [19]

Binder et al.

[11] Patent Number: 4,957,602

[45] Date of Patent: Sep. 18, 1990

[54] METHOD OF MODIFYING THE DIELECTRIC PROPERTIES OF AN ORGANIC POLYMER FILM

[75] Inventors: Michael Binder, Brooklyn, N.Y.; Robert J. Mammone, South Plainfield, N.J.

[73] Assignee: The United States of America as represented by the Secretary of the Army, Washington, D.C.

[21] Appl. No.: 374,125

[22] Filed: Jun. 12, 1989

[51] Int. Cl.$^5$ .............................................. C23C 14/48
[52] U.S. Cl. ........................... 204/192.31; 250/492.3; 427/38
[58] Field of Search ..................... 204/192.31; 427/38; 250/492.3, 492.1

[56] References Cited

U.S. PATENT DOCUMENTS

| | | | |
|---|---|---|---|
| 4,291,244 | 9/1981 | Beach et al. | 427/70 X |
| 4,394,426 | 7/1983 | Shimizu et al. | 427/74 X |
| 4,452,827 | 6/1984 | Koler et al. | 427/38 |
| 4,554,208 | 11/1985 | MacIver et al. | 427/38 X |
| 4,618,505 | 10/1986 | MacIver et al. | 427/38 |
| 4,743,493 | 5/1988 | Sioshansi et al. | 427/38 X |
| 4,820,580 | 4/1989 | Hocker et al. | 427/38 X |

*Primary Examiner*—Nam X. Nguyen
*Attorney, Agent, or Firm*—Michael Zelenka; Roy E. Gordon

[57] ABSTRACT

The dielectric properties of an organic polymer film are modified by ion implantation.

3 Claims, No Drawings

METHOD OF MODIFYING THE DIELECTRIC PROPERTIES OF AN ORGANIC POLYMER FILM

The invention described herein may be manufactured, used, and licensed by or for the Government for governmental purposes without the payment to us of any royalty thereon.

This invention relates in general to a method of modifying the dielectric properties of an organic polymer film by ion implantation and in particular to such a method for modifying the dielectric properties of a film of a Poly-p-Xylylene formed by vapor deposition polymerization.

BACKGROUND OF THE INVENTION

Poly-p-Xylylenes, also known by their trade name of Parylene, are well known conformal coatings that are primarily used as insulators and isolators in electronics. These materials are interesting because of their ability to provide ultrathin films that conform to substrates of varied geometrical shapes and irregularities. Poly-p-Xylylenes are insoluble in every known organic solvent at room temperature and are tough, moisture resistant and impermeable to most gases and vapors. They have a stable temperature coefficient of capacitance that is independent of the temperature, and yet films remain tough and flexible at extremely low temperatures Because Poly-p-Xylylenes are formed by vapor deposition polymerization, very thin, high quality pinhole free films of about 100 angstroms in thickness can be made with outstanding conformality and thickness uniformity. The film is firmly and contiguously bonded to a metallic substrate. Flexing does not separate these coatings from the metal. Bulk electrical properties are extremely stable with temperature and frequency while dielectric constants are unaffected by absorption of atmospheric water. Bulk resistivities are attractively high. All of these characteristics make this material very suitable as a dielectric for capacitor applications.

In some capacitor applications however, very high energy density storage capabilities are required. Therefore, a polymer with a very high dielectric constant is needed.

SUMMARY OF THE INVENTION

The general object of this invention is to provide a method of preparing an organic polymer film that will have desirable characteristics for capacitor applications.

A more particular object of the invention is to provide a method of modifying the dielectric properties of a film of a Poly-p-Xylylene formed by vapor deposition polymerization so that the film will have a higher dielectric constant.

It has now been found that the aforementioned objects can be attained by irradiating a highly insulating vapor deposited thin film of a Poly-p-Xylylene with various doses of ions. The bulk dielectric constant increases from a value close to 3 before ion irradiation to approximately 15 after an ion flux of $10^6$Cl ions/cm$^2$. Bulk conductivity and dielectric losses also increase with ion irradiation.

DESCRIPTION OF THE PREFERRED EMBODIMENT

Samples of polymonochloroparaxylylene (Parylene C) of 1.6 micron in thickness are deposited on 0.05 inch aluminum coupons. These films are then implanted with chloride ions at fluence levels of $10^{14}$–$2 \times 10^{16}$ ions per cm$^2$ and acceleration voltages (beam energies) of 50 and 150 kEv. The two energies used for each sample are designed to insure a fairly uniform distribution of defects in the material. Penetration depths of 50 keV and 150 keV chloride ions into the Parylene C are estimated to be approximately 0.3 and 0.7 micron respectively. Beam currents are kept below 1 microamp to minimize effects of beam heating. From capacitance values measured with an RCL bridge in the parallel mode at 10 KHz, corresponding values of relative dielectric constants are then calculated by treating the dielectric sample as a dielectric layer between parallel plate conductors and using the relationship:

Relative Dielectric Constant = $(C)(T)/[(8.8 \times 10^{14})(A)]$ where

C = measured film capacitance in Farads
T = film thickness in cm
A = film cross sectional area in cm$^2$ Results of dielectric measurements on both fresh and irradiated Parylene C films for various ion fluences are summarized in Table 1.

| ION FLUENCE | FILM COLOR | DIELECTRIC CONSTANT | Tan γ | RESISTANCE (through film) |
|---|---|---|---|---|
| none | clear | 2.82 | 0.0381 | >30 Mohm |
| 1 × 10$^{14}$ | pale-yellow | 3.03 | 0.0212 | >30 Mohm |
|  |  | 3.26 | 0.0320 | 20 Mohm |
| 1 × 10$^{15}$ | gold | 3.41 | 0.454 | 11.3 Mohm |
|  |  | 3.24 | 0.530 | 7.1 Mohm |
| 2 × 10$^{15}$ | brown | 4.02 | 0.510 | 7.2 Mohm |
| 5 × 10$^{15}$ | dark brown | 5.20 | 1.183 | 3.46 Kohm |
| 1 × 10$^{16}$ | dark brown-black | 14.28 | 1.19 | 1.06 Kohm |
|  |  | 13.69 | 2.82 | 0.68 Kohm |
| 2 × 10$^{16}$ | dark-brown-black | 9.59 | 4.56 | 0.51 Kohm |

In TABLE 1, measured dielectric properties include dielectric constant, bulk resistivity and tan γ. Tan γ is essentially the energy loss under an alternating field and is a convenient measure of energy lost divided by energy stored in a dielectric during a half cycle of alternating field. It is basically the complex portion of the dielectric constant divided by the real component. The angle γ is the difference in phase from pi/2 between the applied voltage and induced current when the dielectric is subjected to a time dependent field.

It can be seen from TABLE 1 that dielectric constants of Parylene film rise from a value near 3 for fresh film to approximately 15 for highly irradiated films. Measured resistance through the film simultaneously falls from a value greater than 30 Mohms for fresh film to approximately 1 Kohm for highly irradiated films. Simultaneously, there is a sharp increase in Tan γ. A threshold ion flux is reached at approximately 2 × 10$^{15}$ ions/cm$^2$ when the dielectric constant sharply rises and resistance falls. At an ion flux greater than $1 \times 10^{16}$ ions/cm$^2$, parylene is probably becoming more amorphous and the merging of localized conducting regions at these high doses reduces charge localization and thus reduces the bulk dielectric constant.

It is believed that the reason for the changes caused by ion implantation are due to the creation of localized conducting regions within the bulk insulating matrix. It has been indicated that heterogeneous conductor-insulator mixtures having two distinct phases with differing electrical conductivities can exhibit anomalously large effective dielectric constants near their percolation thresholds. The percolation threshold is the point at which conducting material is present in sufficient volume fraction to form continuous channels within the host matrix. Below this concentration, conducting regions are separated from each other by insulating barriers. Since there is no communication between conducting regions, an electric field applied across such a heterogeneous structure forces charge to accumulate at the conductor insulator interface (since they cannot pass through the insulating region). This development of interfacial polarization effects within the bulk material gives rise to extremely high dielectric constants. The data obtained in the preferred embodiment agrees with the percolation threshold concept.

We wish it to be understood that we do not desire to be limited to the exact details of construction shown and described for obvious modifications will occur to a person skilled in the art.

What is claimed is:

1. Method of modifying the dielectric properties of a vapor deposited thin film of a poly-p-xylylene comprising irradiating the vapor deposited thin film of a poly-p-xylylene with doses of ions.

2. Method according to claim 1 wherein the Poly-p-Xylylene is polymonochloroparaxylylene.

3. Method according to claim 2 wherein the film of polymonochloroparaxylylene is irradiated with an ion flux of $10^{16}$ Cl ions/cm.

* * * * *